United States Patent [19]
Denison et al.

[11] Patent Number: 5,841,623
[45] Date of Patent: Nov. 24, 1998

[54] CHUCK FOR SUBSTRATE PROCESSING AND METHOD FOR DEPOSITING A FILM IN A RADIO FREQUENCY BIASED PLASMA CHEMICAL DEPOSITING SYSTEM

[75] Inventors: Dean R. Denison, San Jose; David R. Pirkle, Soquel; Alain Harrus, Palo Alto, all of Calif.

[73] Assignee: Lam Research Corporation, Fremont, Calif.

[21] Appl. No.: 577,535

[22] Filed: Dec. 22, 1995

[51] Int. Cl.$^6$ ...................................................... H02N 13/00
[52] U.S. Cl. ............................................. 361/234; 279/128
[58] Field of Search .................................... 361/233, 234; 279/128

[56] References Cited

U.S. PATENT DOCUMENTS

| | | |
|---|---|---|
| 4,340,462 | 7/1982 | Koch . |
| 4,384,918 | 5/1983 | Abe .......................................... 361/234 |
| 4,502,094 | 2/1985 | Lewin et al. . |
| 4,554,611 | 11/1985 | Lewin . |
| 4,615,755 | 10/1986 | Tracy et al. . |
| 4,617,079 | 10/1986 | Tracy et al. . |
| 4,665,463 | 5/1987 | Ward et al. . |
| 4,692,836 | 9/1987 | Suzuki . |
| 4,724,510 | 2/1988 | Wicker et al. . |
| 4,733,632 | 3/1988 | Ohmi et al. ............................... 361/234 |
| 4,962,441 | 10/1990 | Collins . |
| 5,055,964 | 10/1991 | Logan et al. . |
| 5,151,845 | 9/1992 | Watanabe et al. . |
| 5,160,152 | 11/1992 | Toraguchi et al. . |
| 5,179,498 | 1/1993 | Hongoh et al. . |
| 5,191,506 | 3/1993 | Logan et al. . |
| 5,262,029 | 11/1993 | Erskine et al. . |
| 5,530,616 | 6/1996 | Kitabayashi et al. .................... 361/234 |
| 5,572,398 | 11/1996 | Federlin et al. ......................... 361/234 |

*Primary Examiner*—Fritz Fleming
*Attorney, Agent, or Firm*—Burns, Doane, Swecker & Mathis, L.L.P.

[57] ABSTRACT

A chuck for processing a substrate includes a chuck body having a dielectric layer, the dielectric layer including a substrate receiving surface, the substrate receiving surface being at least as large as a substrate to be processed on the chuck. The chuck further includes an electrode buried in the chuck body, the electrode being larger than the substrate receiving surface such that edges of a radio frequency field generated by the electrode are all disposed beyond the substrate receiving surface. A method for depositing a film in a radio frequency biased plasma chemical deposition system is also disclosed.

14 Claims, 2 Drawing Sheets

CHUCK FOR SUBSTRATE PROCESSING AND METHOD FOR DEPOSITING A FILM IN A RADIO FREQUENCY BIASED PLASMA CHEMICAL DEPOSITING SYSTEM

FIELD OF THE INVENTION

The present invention relates to a chuck for substrate processing and, more particularly, to a chuck for uniform deposition of a film in a radio frequency biased plasma chemical deposition system.

BACKGROUND AND SUMMARY OF THE INVENTION

In chemical vapor deposition (CVD) processes, a thin film of material is deposited on a substrate by reacting gas phase materials to form a solid reaction product that deposits on the substrate. CVD processes include thermal assisted and plasma assisted processes. Plasma CVD reactors are equipped with the capacity to apply a direct current or radio frequency bias voltage to a substrate during plasma assisted deposition. The direct current or radio frequency bias voltage permits enhancement or modification of characteristics of the depositing film. These characteristics may include film stress, film stoichiometry, thickness uniformity, deposition rate, and refractive index.

Certain types of plasma CVD reactors apply radio frequency bias voltage to the substrate by means of an electrode buried in a chuck body beneath a dielectric layer. U.S. Pat. No. 5,151,845 to Watanabe et al., U.S. Pat. No. 5,179,498 to Hongoh et al., and U.S. Pat. No. 5,191,506 to Logan et al., and U.S. patent application Ser. No. 08/474,009, filed Jun. 7, 1995, all disclose various forms of chucks having buried electrodes and are incorporated by reference.

In some reactors, such as high density plasma systems utilizing electron cyclotron resonance or inductively coupled plasma sources, the deposition of dielectric films can require high levels of rf bias (e.g., 8 to 10 Watts/cm$^2$) to achieve desired film characteristics. At the higher rf levels, film characteristics may be made more non-uniform as a result of rf field and plasma sheath effects at the edge of the substrate. This may be illustrated from the recognition that, with prior art deposition processes and apparatus, the refractive index of deposited $SiO_2$ may be higher at the wafer edge than in the center. The degree of refractive index increase is the same regardless of the diameter of the wafer when the wafer is mounted on a chuck of the same diameter. This suggests that the rf field plays a dominant role in the film stoichiometry and, hence, the refractive index.

It is desirable to provide an improved method and apparatus for processing substrates whereby edge effects at the substrate edges can be minimized.

In accordance with one aspect of the present invention, a chuck for processing a substrate is provided. The chuck includes a chuck body having a dielectric layer, the dielectric layer including a substrate receiving surface, the substrate receiving surface being at least as large as a substrate to be processed on the chuck. The chuck further includes an electrode buried in the chuck body, the electrode being larger than the substrate receiving surface such that edges of a radio frequency field generated by the electrode are all disposed beyond the substrate receiving surface.

In accordance with another aspect of the present invention, a chuck for processing a substrate includes a chuck body having a dielectric layer, the dielectric layer including a substrate receiving surface, an outside portion of the dielectric layer outside of the substrate receiving surface being thicker than an inside portion of the dielectric layer forming the substrate receiving surface.

In accordance with another aspect of the present invention, a method for depositing a film in a radio frequency biased plasma chemical deposition system is provided. According to the method, a chuck body is provided. The chuck body has a dielectric layer, the dielectric layer including a substrate receiving surface. The chuck body has an electrode buried therein, the electrode being larger than the substrate receiving surface such that edges of a radio frequency field generated by the electrode are all disposed beyond the substrate receiving surface. A substrate is positioned on the substrate receiving surface. A radio frequency field is generated with the electrode such that edges of the radio frequency field are disposed beyond edges of the substrate.

In accordance with still another aspect of the present invention, a method for depositing a film in a radio frequency biased plasma chemical deposition system is provided. According to the method, a chuck body is provided. The chuck body has a dielectric layer, the dielectric layer including a substrate receiving surface. A portion of the dielectric layer outside of the substrate surface is thicker than an inside portion of the dielectric layer forming the substrate receiving surface. The chuck body has an electrode buried therein. A substrate is positioned on the substrate receiving surface. A radio frequency field is generated with the electrode.

BRIEF DESCRIPTION OF THE DRAWINGS

The features and advantages of the present invention are well understood by reading the following detailed description in conjunction with the drawings in which like numerals indicate similar elements and in which.

DETAILED DESCRIPTION

Figure 1:
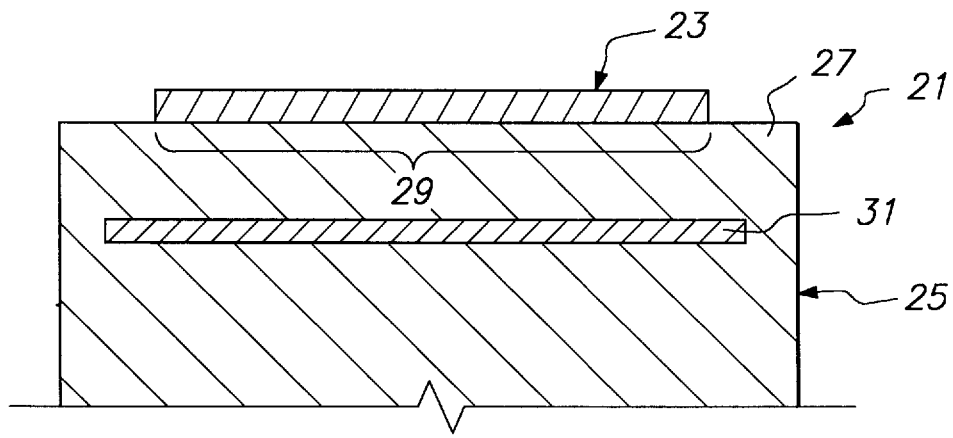
FIG. 1 is a schematic side view of a portion of a chuck according to an embodiment of the present invention.

An embodiment of a chuck 21 according to the present invention is shown in FIG. 1. The chuck 21 is used for processing a substrate 23 such as a wafer during chemical vapor deposition (CVD) processing wherein a film of oxide, nitride, metal, glass or other CVD deposited material is applied to the substrate. Various well known chucks used in known CVD equipment may be adapted for use in connection with the present invention. Particularly preferred chucks are of the type manufactured by Toto Ltd., Fukuoka, Japan, having an approximately 150 mm or 200 mm diameter. The substrate 23 is secured in position on the chuck 21 by any suitable means. For example, the chuck 21 may be an electrostatic chuck of the type that holds the substrate 23 in position by means of electrostatic forces, or a chuck of the type having a clamp for clamping a substrate to the substrate receiving surface.

The chuck 21 includes a chuck body 25 having a dielectric layer 27. The dielectric layer 27 is preferably formed of an aluminum oxide material. The dielectric layer 27 includes a substrate receiving surface 29 on which the substrate 23 is received. The substrate receiving surface 29 is at least as large as the substrate 23 to be processed on the chuck 21.

An electrode 31 for generating an rf field during CVD processing is buried in the chuck body 25. The electrode 31 is larger than the substrate receiving surface 29 such that edges of the rf field generated by the electrode are all disposed beyond the substrate receiving surface. Since the substrate receiving surface 29 is at least as large as the substrate 23, the edges of the rf field are also all disposed beyond edges of the substrate. Thus, CVD processing of the substrate 23 on the chuck 21 is improved since the edge of the substrate is disposed inwardly from the edge of the rf field to a position where rf field characteristics are more uniform than at the edge of the field.

Figure 2:
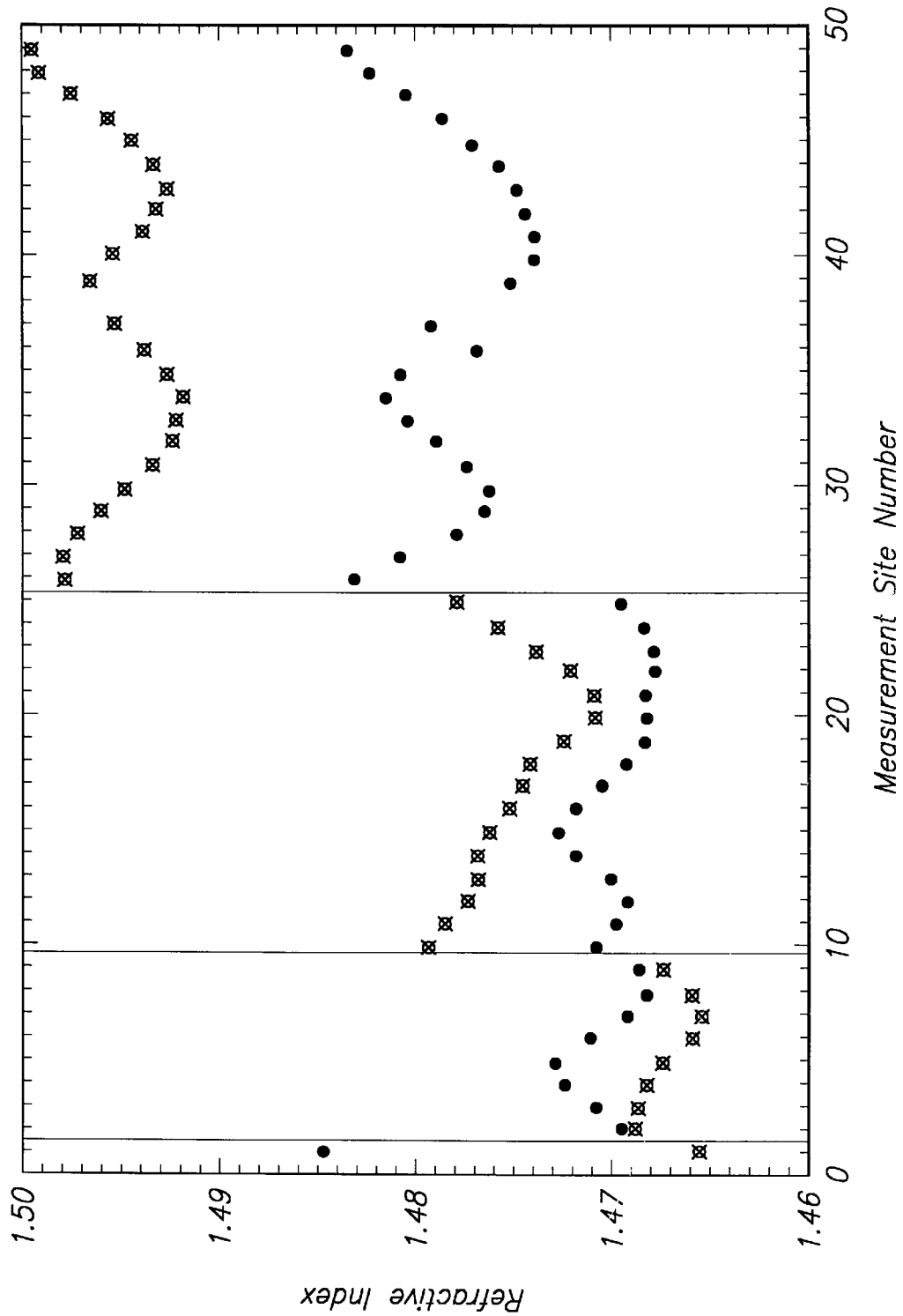
FIG. 2 is a graph illustrating refractive index at forty-nine different sample points on substrates after processing according to the prior art and according to an embodiment of the present invention, wherein one of the sample points is at a centerpoint of the substrates, eight of the sample points are spaced at equal angular separation at a radius of 23 mm; sixteen sites at a radius of 46 mm; and twenty-four sites at a radius of 69 mm.

FIG. 2 graphically illustrates an improvement in refractive index uniformity of $SiO_x$ between processed substrates, the substrates being wafers having approximately 150 mm diameter. One of the substrates is subjected to CVD processing in a conventional processing apparatus using a conventional chuck having a buried rf powered electrode extending to within 5 mm from the outer periphery of the chuck. The conventional chuck has a diameter substantially equal to the diameter of the substrate. Another of the substrates is subjected to CVD processing in a processing apparatus according to the present invention that includes a chuck of the type having a buried rf powered electrode that extends beyond the edge of the substrate, the electrode extending approximately 2 cm radially past the wafer edge so that the rf edge effect occurs approximately 2 cm from the wafer edge. The data presented in FIG. 2 was generated using the inventive chuck shown in FIG. 1. The inventive chuck has a radius approximately 2.5 cm greater than the wafer radii. Forty-nine measurement sites of a Therma-Wave Optiprobe device, available from Therma-Wave, Fremont, Calif., are illustrated in FIG. 2: one site being a center point; eight sites being spaced at equal angular separation at a radius of 23 mm; sixteen sites at a radius of 46 mm; and twenty-four sites at a radius of 69 mm. The solid dots represent refractive indices at the measurement sites on the substrate processed with the chuck according to the present invention, while the X's represent refractive indices at the measurement sites on the substrate processed with a conventional apparatus having an electrode with approximately the same diameter as the substrate. It will be seen that, in the apparatus according to the present invention, where edge effects are moved outwardly from the substrate, greater uniformity in deposition characteristics is achieved than where the edge of the rf field is located substantially at the edge of the substrate as in conventional apparatuses.

Figure 3:
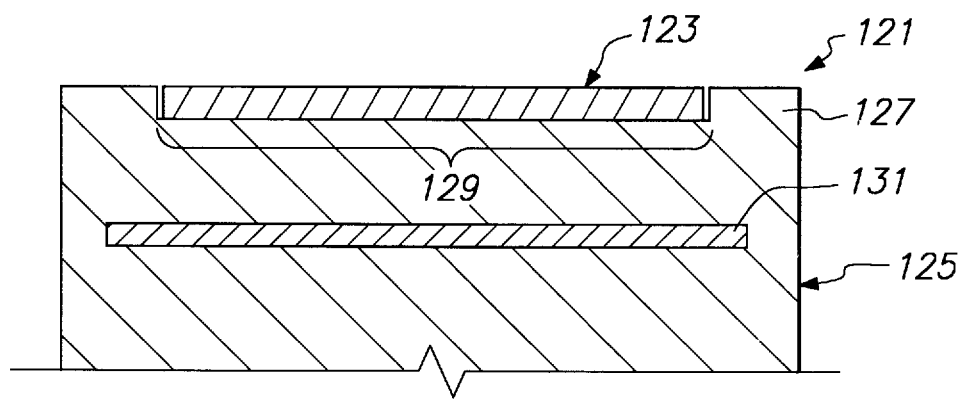
FIG. 3 is a schematic, partially cross-sectional side view of a portion of a chuck according to an embodiment of the present invention.

A chuck 121 according to a further embodiment of the present invention is shown in FIG. 3. The chuck 121 is used in processing a substrate 123, which may be the same as the substrate 23, and includes a chuck body 125, a dielectric layer 127, and a substrate receiving surface 129. The chuck 121 includes a buried electrode 131 that extends beyond the edges of the substrate 123 receiving surface such that edges of an rf field produced by the electrode also extend past the edges of the substrate.

In the chuck 21 shown in FIG. 1, since the center region of the chuck is covered by the substrate 23, and the outer annulus of the chuck is not covered, there are substantial differences between the capacitance per unit area of the two regions. For example, in the chuck 121 shown in FIG. 3, it can be shown that the capacitance per unit area is:

$$C=\epsilon_0 k_1 k_2/[t_1(k_2-k_1)+(t_1+t_2)k_1]$$

where:
$\epsilon$=permittivity of free space ($8.85\times10^{-12}$ F/m);
$k_1$ and $k_2$=the dielectric constants of the chuck ceramic and the substrate, respectively;
$t_1$ and $t_2$=the thicknesses of the chuck ceramic and the substrate, respectively.

As an example, a chuck of Ti-doped alumina having the configuration shown in FIG. 1 is characterized by: $k_1$ is 200; $k_2$ is 11; $t_1$ is 200 $\mu$m; and $t_2$ is 730 $\mu$m, the capacitance per unit area between the electrode and the plasma is 14.7 pF/cm$^2$ in the wafer covered region and 88.5 pF/cm$^2$ in the uncovered annulus.

Ideally, capacitance in the covered and uncovered regions are equal. One way of equalizing capacitance in the regions is to make the chuck dielectric thicker in the annular region. However, by the foregoing equation, where $k_1$ and $k_2$ are both 200 in the annular area outside of the wafer, a thickness of 1.2 cm in the annular area would be required, which is not preferred because such an extending dielectric region would extend far above the wafer surface and would likely be a source of particulate contamination, even if logistical problems associated with loading and unloading the wafer are overcome. However, such a chuck design in the FIG. 1 configuration provides substantially improved refractive index uniformity compared to a conventional chuck, as shown in FIG. 2.

A further improvement in performance results can be obtained using a lower dielectric constant material in the chuck construction. For example, if aluminum oxide is used to form the chuck body 125, the dielectric constant $k_1$ is 9. By the equation above, the capacitance per unit area in the substrate covered region would be 1 nF/cm$^2$ and in the exposed area it would be about 4 nF/cm$^2$. It is preferred to both provide a thicker annulus around the substrate receiving surface 129 and use a material for the chuck body 125 having a low dielectric constant such that capacitance per unit area of the outer annular portion of the chuck body is equal to capacitance per unit area of the inside portion or substrate receiving surface of the chuck body. In the example discussed above, where the dielectric constant $k_1$ is 9, if the thickness of the annular area around the wafer is increased (and, thus, $k_2$ is also 9) then, to have the rf performance of the exposed annular area be the same as the covered area, the thickness of the exposed annular area would be approximately 797 $\mu$m.

A method for depositing a film in a radio frequency biased plasma chemical deposition system according to the present invention is described with reference to FIG. 1 (or FIG. 3). A chuck 21 (121) having a chuck body 25 (125) having a dielectric layer 27 (127) is provided. The dielectric layer 27 (127) includes a substrate receiving surface 29 (129). The chuck body 25 (125) has an electrode 31 (131) for generating an rf field buried therein. The electrode 31 (131) is larger than the substrate receiving surface 29 (129) such that edges of the rf field generated by the electrode 31 (131) are all disposed beyond the substrate receiving surface 29 (129). The substrate 23 (123) is positioned on the substrate receiving surface 29 (129). An rf field is generated with the electrode such that edges of the radio frequency field are disposed beyond edges of the substrate. In the embodiment of the method shown in FIG. 3, the chuck body 125 is formed such that a portion of the chuck body outside of the substrate receiving surface 129 is thicker than an inside portion of the chuck forming the substrate receiving surface.

While this invention has been illustrated and described in accordance with a preferred embodiment, it is recognized that variations and changes may be made therein without departing from the invention as set forth in the claims.

What is claimed is:

1. A chuck for processing a substrate in a plasma reaction chamber, comprising:

a chuck body having a dielectric layer, the dielectric layer including a substrate on a substrate receiving surface, the substrate receiving surface being at least as large as a substrate to be processed on the chuck;

an electrode buried in the chuck body, the electrode being larger than the substrate receiving surface such that edges of a radio frequency field generated by the electrode are substantially disposed beyond the substrate receiving surface, the electrode having an outer periphery located between an outer periphery of the substrate and an outer periphery of the chuck body.

2. The chuck as set forth in claim 1, wherein an outside portion of the dielectric layer outside of the substrate receiving surface is thicker than an inside portion of the dielectric layer forming the substrate receiving surface.

3. The chuck as set forth in claim 1, wherein the chuck is an electrostatic chuck.

4. The chuck as set forth in claim 1, further comprising a movable clamp ring for clamping a substrate to the substrate receiving surface.

5. The chuck as set forth in claim 1, wherein the outer periphery of the electrode is located about 20 mm beyond the outer periphery of the substrate.

6. The chuck as set forth in claim 1, wherein the electrode is a monopolar electrode.

7. The chuck as set forth in claim 1, wherein the plasma reaction chamber is a chemical vapor deposition reactor.

8. The chuck as set forth in claim 1, wherein the plasma in the plasma reaction chamber is generated by electron cyclotron resonance.

9. A chuck for processing a substrate in a plasma reaction chamber, comprising:

a chuck body having a dielectric layer, the dielectric layer including a substrate receiving surface, the substrate receiving surface being at least as large as a substrate to be processed on the chuck;

an electrode buried in the chuck body, the electrode being larger than the substrate receiving surface such that edges of a radio frequency field generated by the electrode are substantially disposed beyond the substrate receiving surface, the outside portion of the dielectric layer being sufficiently thick such that capacitance per unit area of the outside portion of the dielectric layer is substantially equal to capacitance per unit area of the combination of the inside portion of the dielectric layer and the substrate.

10. The chuck as set forth in claim 9, wherein the dielectric layer of the chuck body is formed of aluminum oxide.

11. A chuck for processing a substrate, comprising:

a chuck body having a dielectric layer, the dielectric layer including a substrate receiving surface, an outside portion of the dielectric layer outside of the substrate receiving surface being thicker than an inside portion of the dielectric layer forming the substrate receiving surface, the outside portion of the dielectric layer being sufficiently thick such that capacitance per unit area of the outside portion of the dielectric layer is substantially equal to capacitance per unit area of the combination of the inside portion of the dielectric layer and the substrate.

12. The chuck as set forth in claim 11, wherein the dielectric layer of the chuck body is formed of aluminum oxide.

13. The chuck as set forth in claim 11, wherein the chuck is an electrostatic chuck.

14. The chuck as set forth in claim 11, further comprising a movable clamp ring for clamping a substrate to the substrate receiving surface.

* * * * *